(12) United States Patent
Matsuoka et al.

(10) Patent No.: US 7,403,260 B2
(45) Date of Patent: Jul. 22, 2008

(54) COATING AND DEVELOPING SYSTEM

(75) Inventors: Nobuaki Matsuoka, Koshi-Machi (JP); Shinichi Hayashi, Koshi-Machi (JP); Yasushi Hayashida, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 403 days.

(21) Appl. No.: 11/156,571

(22) Filed: Jun. 21, 2005

(65) Prior Publication Data
US 2006/0201615 A1 Sep. 14, 2006

(30) Foreign Application Priority Data
Mar. 11, 2005 (JP) ............... 2005-069682

(51) Int. Cl.
*G03B 27/52* (2006.01)
*G03D 5/00* (2006.01)
(52) U.S. Cl. .................... 355/27; 396/611
(58) Field of Classification Search ........... 396/611; 355/27, 29
See application file for complete search history.

(56) References Cited
U.S. PATENT DOCUMENTS
6,515,731 B1 * 2/2003 Akimoto ............... 355/27
7,267,497 B2 * 9/2007 Akimoto et al. ........... 396/611

FOREIGN PATENT DOCUMENTS
JP 3337677 8/2002
JP 2004-193597 7/2004

* cited by examiner

*Primary Examiner*—Della J. Rutledge
(74) *Attorney, Agent, or Firm*—Oblon, Spivak, McClelland, Maier & Neustadt, P.C.

(57) ABSTRACT

The coating and developing system carries a substrate delivered to a carrier handling block to a processing block to form a film on the substrate by a coating block included in the processing block, carries the substrate through an interface block to the exposure system, processes the substrate having the exposed film by a developing process by a developing block included in the processing block and returns the thus processed substrate to the carrier handling block. A direct carrying means is superposed on the coating block and the developing block to carry a substrate having a surface coated with a film from the carrier handling block directly to the interface block. A test substrate can be carried to the exposure system to inspect the condition of the exposure system even in a state where the coating block and the developing block are under maintenance work.

23 Claims, 9 Drawing Sheets

COATING AND DEVELOPING SYSTEM

TECHNICAL FIELD

The present invention relates to a coating and developing system for applying a liquid resist to a surface of a substrate, such as a semiconductor wafer or a glass substrate for a liquid crystal display to coat the surface with a resist film and developing the exposed resist film.

BACKGROUND ART

A series of processes for forming a resist pattern on a substrate, such as a semiconductor wafer (hereinafter referred to simply as "wafer") is carried out by a resist pattern forming system including, in combination, a coating and developing system for applying a liquid resist to the surface of a substrate to form a resist film and developing the exposed resist film, and an exposure system.

A coating and developing system disclosed in, for example, Patent document 1 includes a film forming block including coating modules for processing a wafer by a coating process before the wafer is subjected to an exposure process, and a developing block including developing modules for processing the wafer processed by the exposure process by a developing process. The coating block and the developing block are superposed. Each of the coating block and the developing block has one end connected to a loading/unloading port and the other end connected to an exposure system by an interface block. This known coating and developing system performs the coating process and the developing process separately to enhance throughput.

The resolution of the exposure system has been improved in recent years. According to the present status of art, the exposure process is capable of achieving a resolution on the order of several tens nanometers by using, for example, an ArF light source (argon fluoride light source). However, the position of a point where light is to be focused is sensitively affected by, for example, the expansion or contraction of a holding member included in an optical system due to a slight change in the environmental condition caused by changes in the atmospheric pressure and weather. The quality of a resist pattern is greatly dependent on such a change of the position of a point where light is to be focused. Therefore, the exposure system needs to be inspected and adjusted frequently, for example, in one day.

There is a tendency to lower the cleanliness of a clean room to reduce the operating cost of a plant. Therefore, the inspection of the exposure system is performed by carrying a test wafer from the carrier handling block of the coating and developing system into the exposure system by the carrying system of the processing block without opening the maintenance door of the exposure system. The coating and developing system mentioned in Patent document 1 needs to use either the coating block or the developing block to carry the test wafer to the exposure system. Therefore, the periodic or occasional inspection and adjustment of the exposure system cannot be done if the coating block and the developing block are under maintenance work or are out of order. Thus the test wafer is carried into the exposure system for the inspection and adjustment of the exposure system after the completion of maintenance work for the coating block and the developing block. Consequently, wafers cannot be processed immediately after the completion of maintenance work for the coating and the developing block, which is one of causes that reduce the throughput of the coating and developing system.

It is an important theme to start up a newly installed semiconductor device fabricating line in a short time. The configuration of the system disclosed in Patent document 1 does not permit the adjustment of the exposure system unless the adjustment of the carrying system of the coating block or the developing block is completed. Since the exposure system has many adjustment items requiring fine adjustment, the adjustment of the exposure system takes a long time. Consequently, it is difficult to reduce time necessary before starting up the semiconductor device fabricating line.

Patent document 1: Jpn. Pat. No. 3337677

DISCLOSURE OF THE INVENTION

The present invention has been made under such circumstances and it is therefore an object of the present invention to provide a coating and developing system that permits maintenance work for an exposure system to be performed at desired time.

A coating and developing system according to the present invention includes: a carrier handling block for receiving a carrier containing substrates; a processing block for forming films including a photosensitive film on a substrate received from the carrier handling block, for developing the exposed photosensitive film processed by an exposure process by an exposure system and for returning the substrate to the carrier handling block; an interface block for transferring the substrate from the processing block to the exposure system and transferring the substrate from the exposure system to the processing block; wherein a) the processing block has coating blocks, for forming the films including the photosensitive film on the substrate, extending between the carrier handling block and the interface block, and a developing block superposed on the coating blocks, b) each of the coating blocks and the developing block is provided with a chemical liquid applying unit for applying a chemical liquid to the substrate, a heating unit for heating the substrate, a cooling unit for cooling the substrate and interblock carrying means for carrying the substrate from one to another of those units, c) a direct carrying means is superposed on the coating block and the developing block to carry a substrate directly between the carrier handling block and the interface block, and d) the direct carrying means carries a substrate coated with the films from a position on the side of the carrier handling block to a position on the side of the interface block.

The coating block may include a layered structure of a resist film forming block for forming a resist film, a first antireflection film forming block for forming a first antireflection film under the resist film, and a second antireflection film forming block for forming a second antireflection film over the resist film. The developing block may be disposed below the coating block.

The direct carrying means may be formed to move in a carrying block separated from the coating block and the developing block. The carrying block lies between the coating block and the developing block. The coating and developing system may include a gas supply unit for supplying a gas, for example, into the carrying block to maintain the carrying block at a positive pressure.

The coating and developing system according to the present invention may include an interblock carrying means for the coating block, an interblock carrying means for the developing block, a plurality of transfer stages stacked up in layers so that a substrate can be transferred between each of the stages and the direct carrying means, and a vertical carrying means capable of transferring a substrate from one to another of the transfer stages. The coating and developing system may include a controller for controlling carrying operations for carrying a substrate, capable of selecting a test substrate carrying mode for carrying a test substrate from the carrier handling block to the exposure system by the direct carrying means to test the condition of the exposure system.

The processing block of the coating and developing system according to the present invention is formed by superposing the coating block extending between the carrier handling block and the interface block, and the developing block. Therefore, the coating and the developing system needs a narrow floor space for installation. Since the coating and developing system is provided with the direct carrying means specially for carrying a substrate directly between the carrier handling block and the interface block, Maintenance operations for the maintenance of the exposure system, the coating block and the developing block can be simultaneously executed to reduce time necessary for completing the maintenance operations. Even if the coating and the developing block are under maintenance work or even if troubles are caused in the coating and the developing block, for example, due to the malfunction of a discharge system, a test substrate for testing the condition of the exposure system can be carried from the carrier handling block to the exposure system by the direct carrying means and hence the inspection of the condition of the exposure system can be timed as desired. Therefore, processes for processing a substrate can be started immediately after the coating block and the developing block have become operative and hence the reduction of throughput can be suppressed. Adjusting work for adjusting the exposure system can be executed separately from adjusting work for adjusting the block carrying means of the coating and the developing block by carrying a test substrate by the direct carrying means, provided that the direct carrying means is adjusted when the coating and developing system is installed, developing conditions can be set if the adjustment of the exposure system has been completed. Consequently, time for starting up the coating and developing system can be curtailed.

BEST MODE FOR CARRYING OUT THE INVENTION

Figure 1:
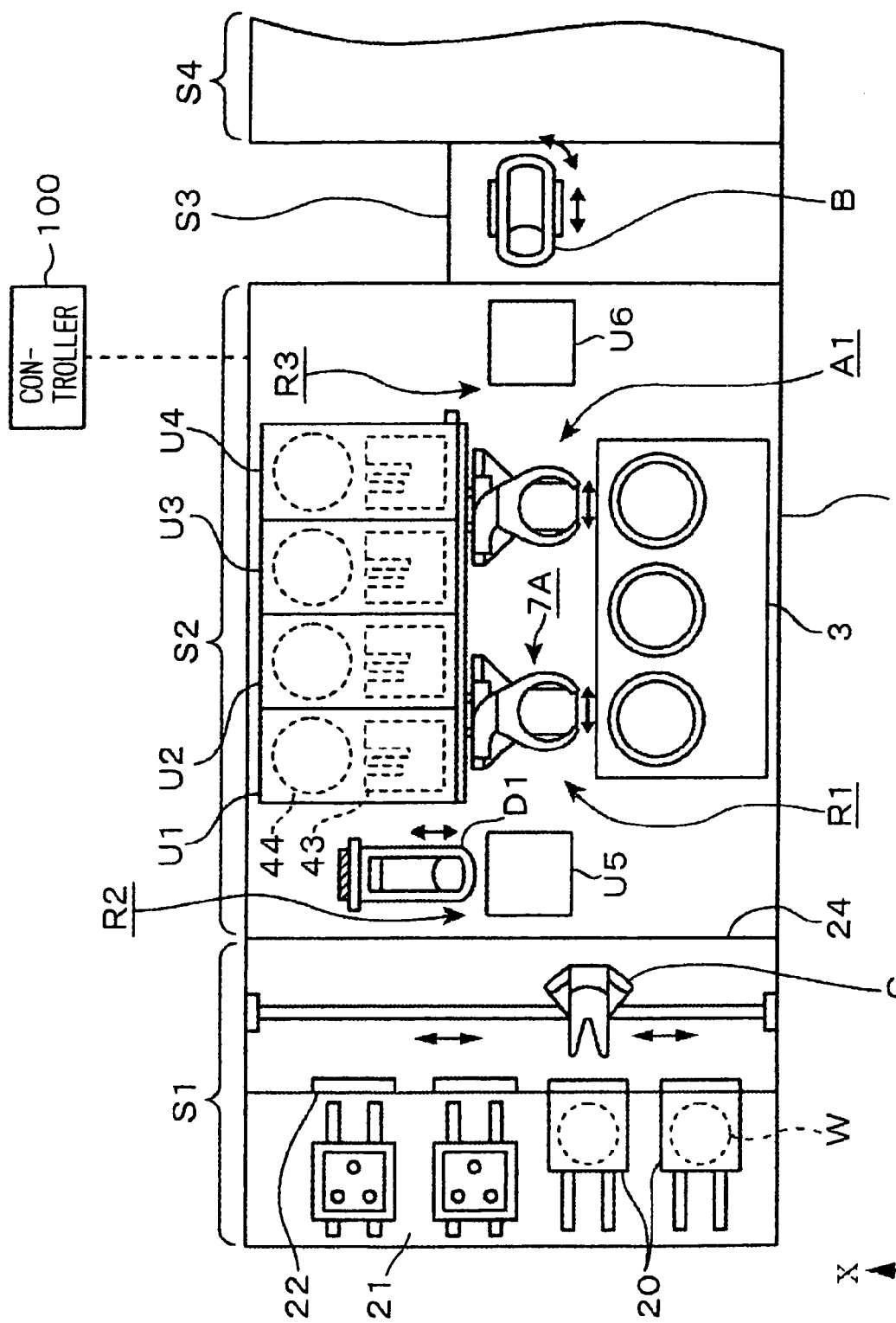
FIG. 1 is a plan view of a coating and developing system in a preferred embodiment according to the present invention.
Figure 2:
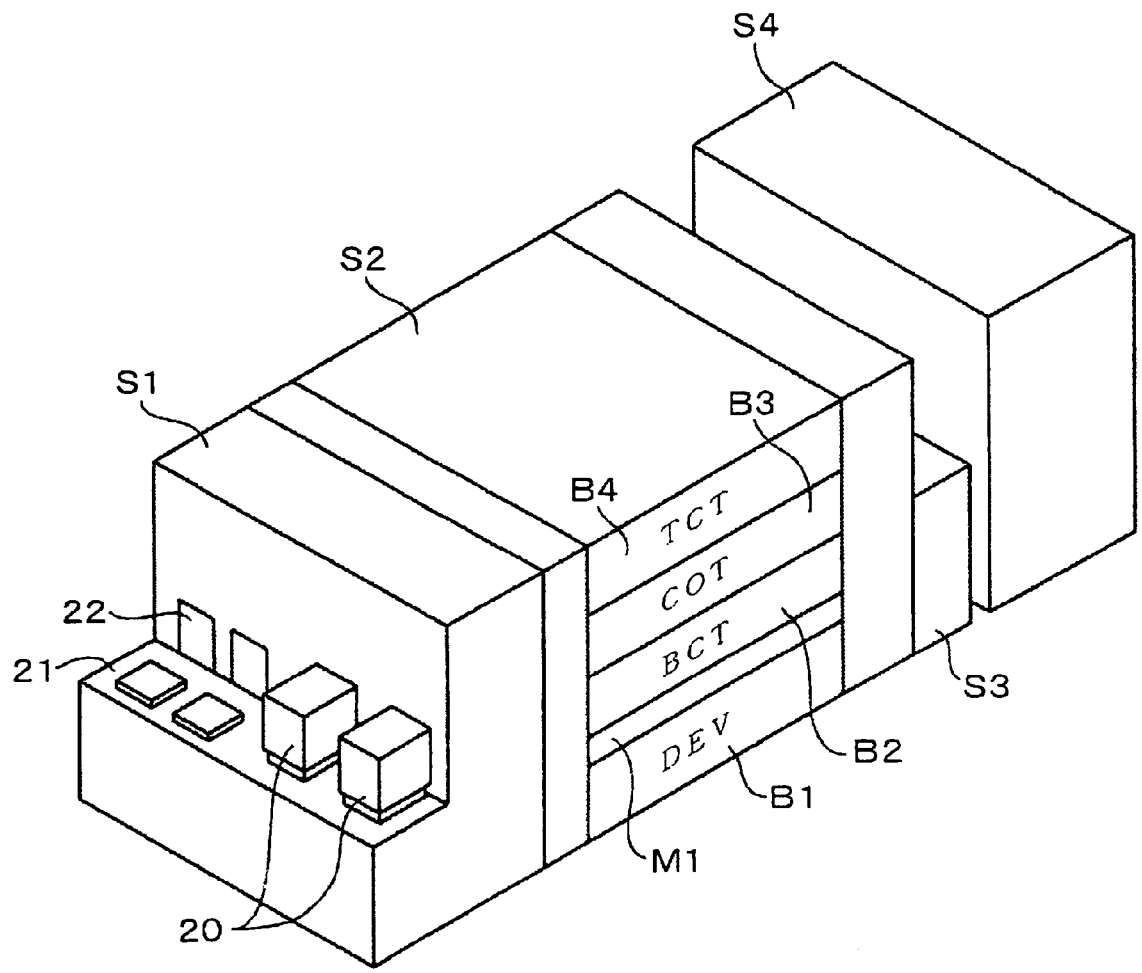
FIG. 2 is a perspective view of the coating and developing system shown in FIG. 1.
Figure 3:
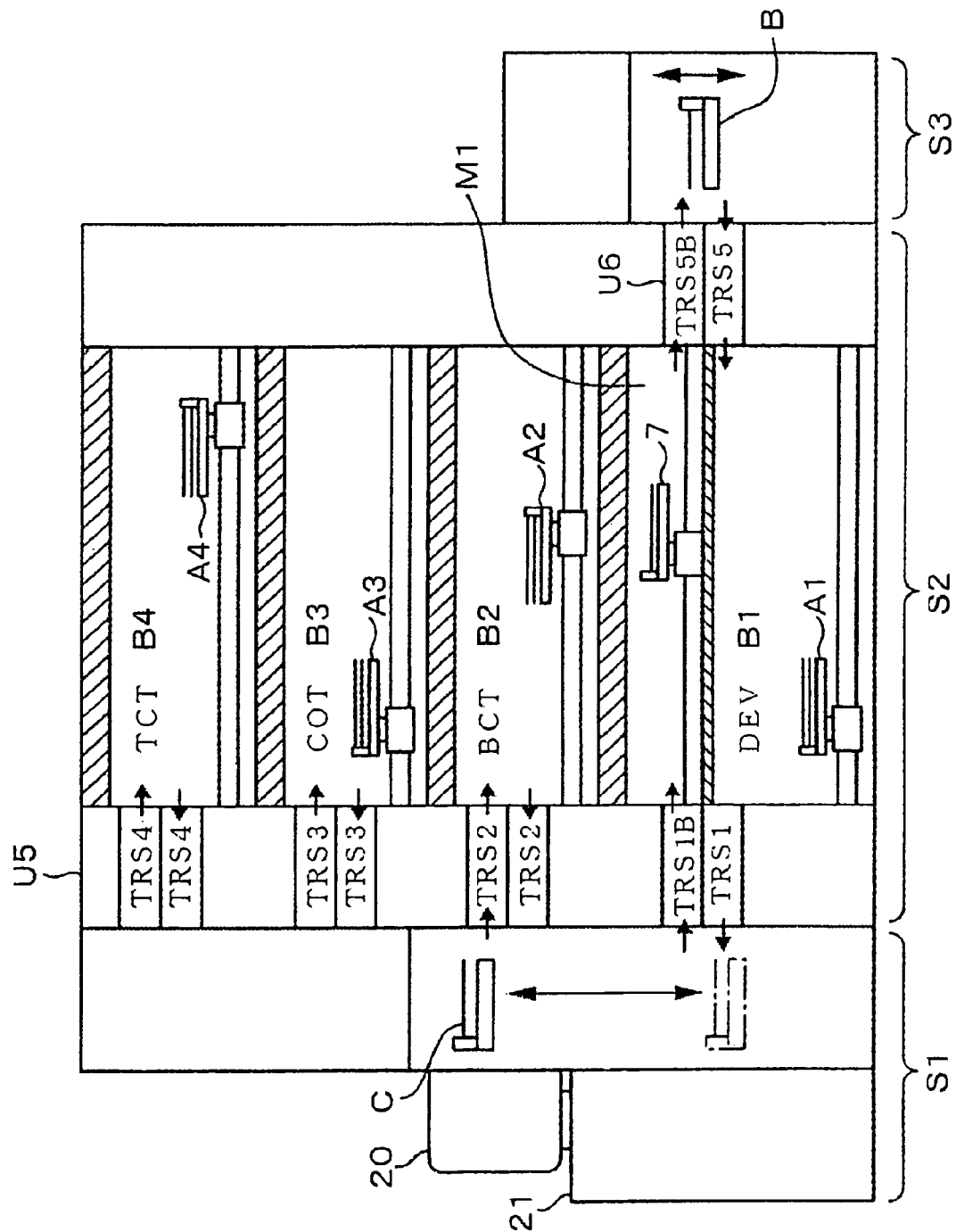
FIG. 3 is a sectional side elevation of the coating and developing system shown in FIG. 1.

A coating and developing system in a preferred embodiment according to the present invention combined with an exposure system will be described. FIG. 1 is a plan view of the coating and developing system, FIG. 2 is a schematic perspective view of the coating and developing system and FIG. 3 is a schematic side elevation of the coating and developing system. The coating and developing system is installed in a clean room in an atmospheric atmosphere. The coating and developing system has a carrier handling block S1, a processing block S2 formed by perpendicularly stacking up, for example, four unit blocks B1 to B4 and a carrying block M1 and an interface block S3. The coating and developing system is combined with an exposure system S4. A closed carrier 20 containing, for example, thirteen wafers W, namely, substrates, is delivered to and is sent out from the carrier handling block S1.

The carrier handling block S1 has a carrier support table 21 capable of supporting a plurality of carriers 20 thereon, gates 22 formed in a wall behind the carrier support table 21, and a transfer arm C capable of extending through the gate 22 to the carrier 20 to take out the wafer W from the carrier 20. The transfer arm C is able to move in horizontal directions and vertical directions, to turn about a vertical axis and to move in directions parallel to a direction in which the carriers 20 are arranged to transfer the wafer W between transfer stages TRS1 and TRS2 of the unit blocks B1 and B2.

The processing block S2 surrounded by a casing 24 is connected to the back end of the carrier handling block S1. In this embodiment, the processing block S2 includes the first unit block (DEV layer) B1 for carrying out a developing process, the carrying block M1, the second unit block (BCT layer) B2 for forming a lower antireflection film under a resist film, the third unit block (COT layer) B3 for carrying out a liquid resist applying process, and the fourth unit block (TCT layer) B4 for forming an upper antireflection film over the resist film. The unit blocks B1 to B4 are stacked upward in that order. The unit blocks B1 to B4 and the carrying block M1 are extended from the carrier handling block S1 toward the interface block S3. The DEV layer B1 corresponds to a developing block, and the BCT layer B2, the COT layer B3 and the TCT layer B4 correspond to coating blocks for forming a resist film of a photosensitive resist. The unit blocks B1 to B5 are arranged vertically upward in that order. The DEV layers B1 and B2 are developing unit blocks, the TCT layer B3, the COT layer B4 and the BCT layer B5 are film forming unit blocks for forming a film of a photosensitive material, such as a photosensitive resist. The unit blocks B1 to B4 and the carrying block M1 are separated by partition plates (base members).

Figure 4:
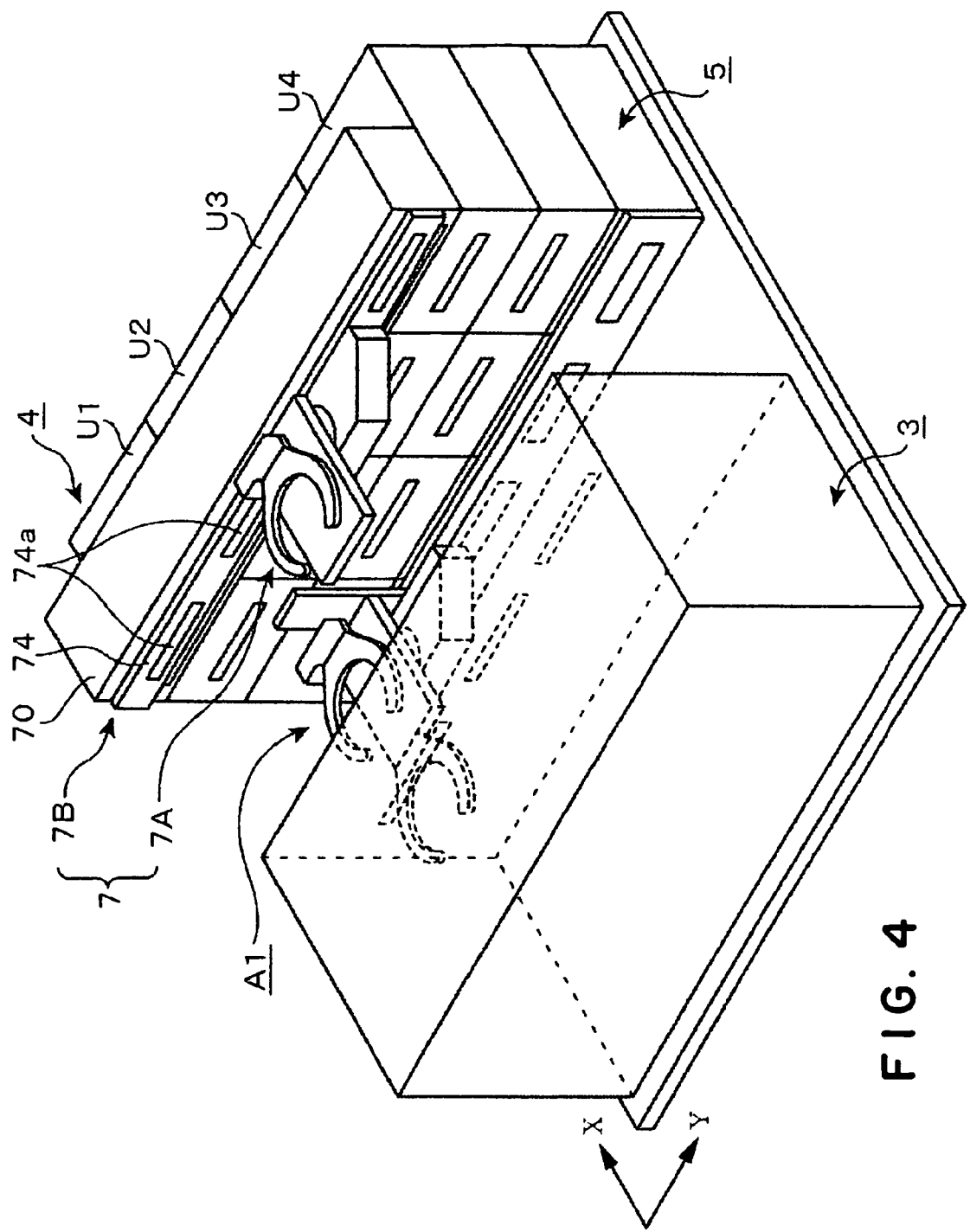
FIG. 4 is a perspective view of a developing unit on a DEV layer, a shelf unit, a main arm and a discharge unit included in the coating and developing system shown in FIG. 1.

The first to the fourth unit block B (the reference character B denotes the first unit block B1, the second unit block B2, the third unit block B3 and the fourth unit block B4 inclusively) will be described. The unit blocks B1 to B4 have many same parts and are substantially similar in layout. Therefore the DEV layer B1 will be described by way of example with reference to FIG. 1. A wafer carrying passage R1 along which a wafer W is carried extends along the length of the DEV layer B1, i.e., in a direction parallel to the Y-axis as viewed in FIG. 1 between the carrier handling block S1 and the interface block S3, A developing unit 3, namely, liquid application unit, having a plurality of liquid application devices for applying a developer to a wafer is disposed on the right side, with respect to a direction from the carrier handling block S1 toward the interface block S3, of the wafer carrying passage R1. Four shelf units U1, U2, U3 and U4 formed by stacking up thermal processing devices of heating and cooling systems are arranged in that order on the left side, with respect to a direction from the carrier handling block S1 toward the interface block S3, of the wafer carrying passage R1. Thus the developing unit 3 and the shelf units U1 to U4 are disposed on the opposite sides of the wafer carrying passage R1. Each of the shelf units U1 to U4 has two thermal processing devices stacked up in two layers. The thermal processing devices carry out a pretreatment before a developing process to be carried out by the developing unit 3 and a posttreatment after the developing process. A discharge unit 5 underlies the shelf units U1 to U5 as shown in FIG. 4.

The thermal processing devices include heating devices 4 for heating a wafer W processed by an exposure process, heating devices for heating a wafer W for drying after a developing process and cooling devices for cooling a wafer W heated by the heating device 4 to adjust the temperature of the wafer W to a predetermined temperature. Each of the shelf units U1, U2 and U3 of the DEV layer B1 has two heating devices 4 put one on top of the other, and the shelf layer U4 has two cooling devices put one on top of the other.

Figure 5A:
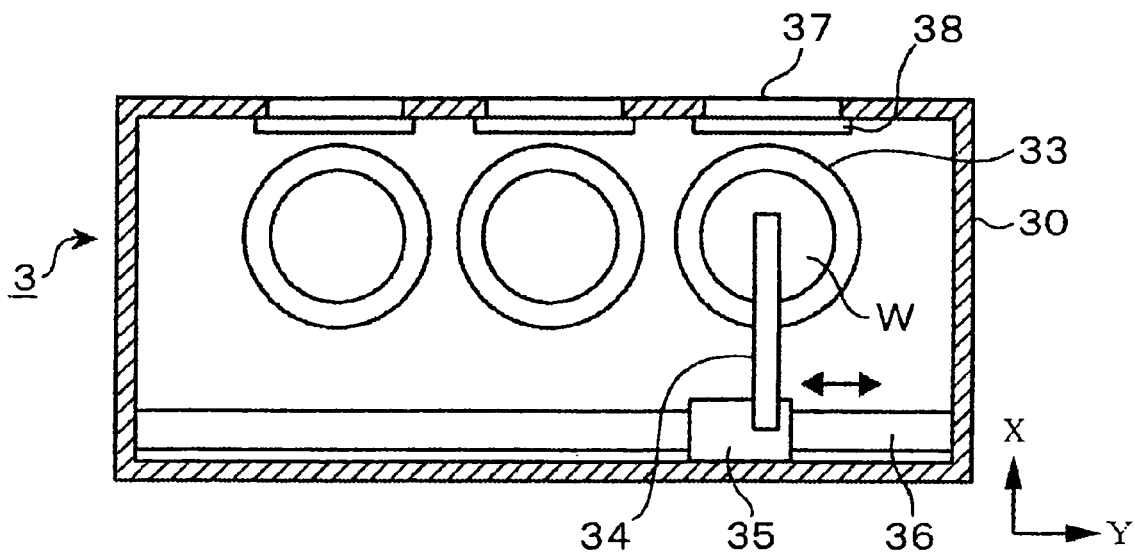
FIGS. 5A and 5B are a plan view and a longitudinal sectional view, respectively, of a developing unit included in the coating and developing system shown in FIG. 1.
Figure 5B:
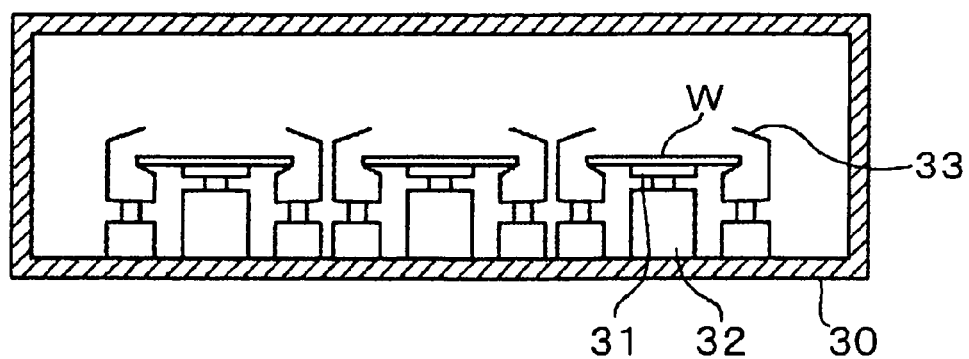

The construction of the developing unit 3 will be briefly described with reference to FIG. 5 (FIGS. 5A, 5B). Three spin chucks 31, namely, wafer support devices, are arranged in a box 30 included in the developing unit 3. Each spin chuck 31 is so supported as to be driven for rotation about a vertical axis by a driving device 32 and to be vertically movable. A cup 33 surrounds the spin chuck 31. A draining device, not shown, including a discharge pipe and a drain pipe is connected to the bottom wall of the cup 33. A chemical liquid pouring nozzle 34 is vertically movable. The chemical liquid supply nozzle 34 is moved along a guide 36 extended parallel to the Y-axis by a driving device 35.

Gates 37 are formed in a side wall, facing the wafer carrying passage R1, of the box 30 of the developing unit 3. A main arm A1 carries a wafer W through the gate 37 into the box 30 and transfers the wafer W to the spin chuck 31. Openable shutters 38 cover the gates 37, respectively, to prevent the flow of particles into the box 30. A developer is poured onto the surface of the wafer W through the chemical liquid supply nozzle 34 to coat the surface of the wafer W with a developer film. A cleaning liquid supply mechanism, not shown, pours a cleaning liquid onto the wafer W to wash off the developer from the surface of the wafer W. Then, the wafer W is dried by rotating the spin chuck 31 supporting the wafer W to complete the developing process.

Figure 6:
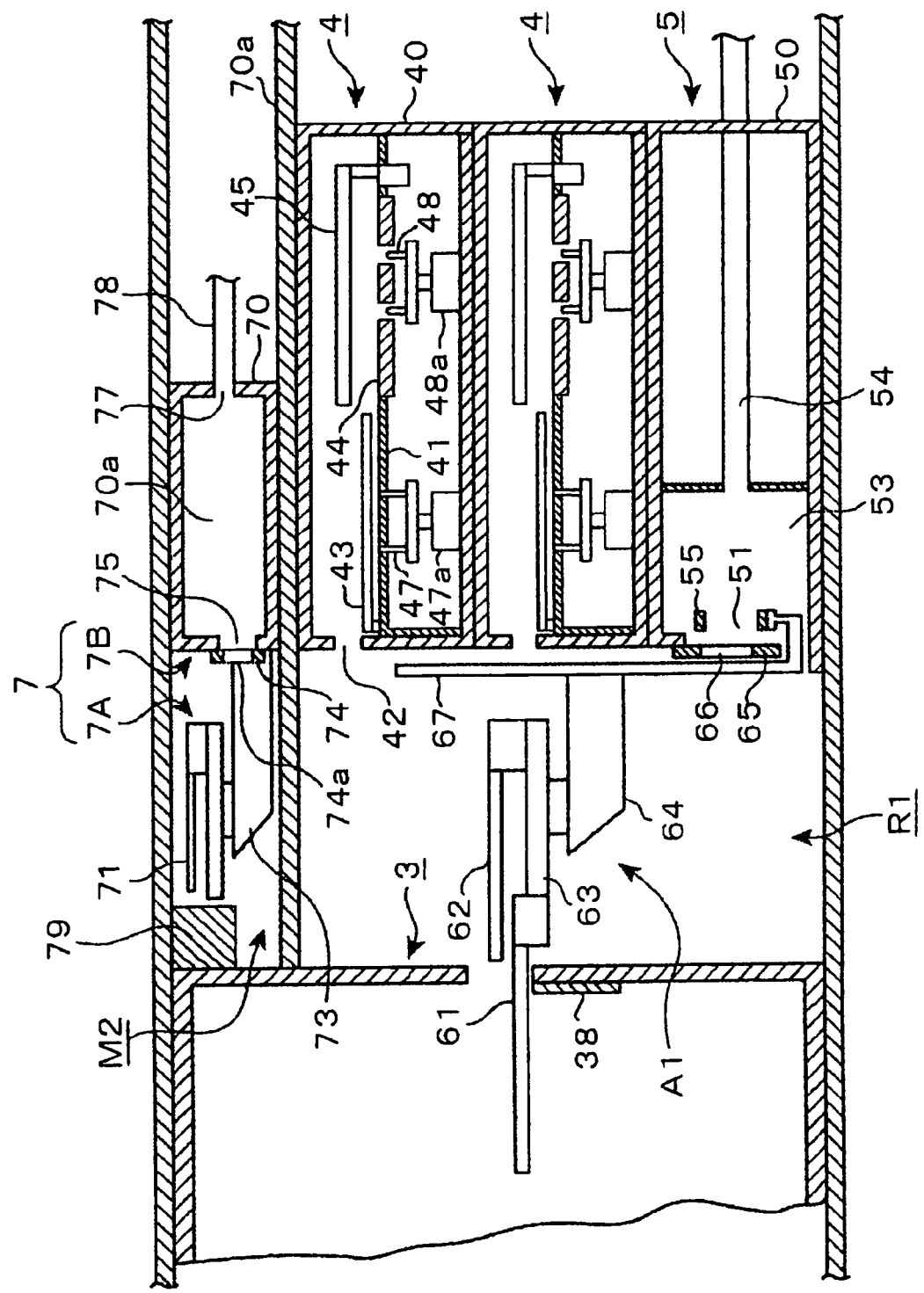
FIG. 6 is a longitudinal sectional view of the DEV layer.

Each of the heating devices 4 included in the shelf units U1 to U3 will be briefly described. Referring to FIG. 6, a base 41 is disposed in a box 40. A gate 41 is formed in a wall, facing the wafer carrying passage R1, of the box 40. Shown in FIG. 6 are cooling plate 3 for preparatory cooling, heating plate 44, a deflecting plate 45, vertically movable lifting pins 47 and 48, and lifting mechanisms 47a and 48a respectively for vertically moving the lifting pins 47 and 48. The cooling plate 43 can be moved on the base 41 onto the heating plate 44. The lifting pins 47 are moved vertically to transfer the wafer W between the main arm A1 and the cooling plate 43. The lifting pins 48 are moved vertically to transfer the wafer W between the cooling plate 43 and the heating plate 44.

The cooling unit has a box 40 having a wall facing the wafer carrying passage R1 and provided with a gate 42, and a water-cooled cooling plate placed in the box 40. Further description of the cooling unit will be omitted because the cooling unit included in the shelf unit U4 is similar in construction to the heating units 4.

The discharge unit 5 has a box 50 defining a discharge chamber and having a wall facing the wafer carrying passage R1 and provided with suction openings 51, a discharge pipe 54 connected to the box 50. Gas is sucked through the discharge pipe 54 to evacuate the discharge chamber 53 of the box 50 at a negative pressure. Consequently, gas is sucked from the wafer carrying passage R1 to remove particles floating in the wafer carrying passage R1.

The main arm A1, namely, a block carrying means, that operates in the wafer carrying passage R1 will be described. The main arm A1 carries a wafer W from one to another of the processing devices of the shelf units U1 to U4, the developing unit 3 and the respective transfer stages of the shelf unit U5 and a shelf unit U6. For example, the main arm A1 has two arm members 61 and 62 capable of coming into contact with a peripheral part of the back surface of a wafer W to support the wafer W thereon. The arm members 61 and 62 are supported on a base 63 for individual forward and backward movement. The base 63 is supported on a lifter base 64 so as to be turnable abut a vertical axis. A guide rail 65 guides the main arm A1 for transverse movement. The guide rail 65 is provided with openings 66 corresponding to the suction openings 51. Gas is sucked from the wafer carrying passage R1 through the openings 66. A vertical guide rail 67 guides the lifter base 64 for vertical movement. A lower end part of the vertical guide rail 67 is formed so as to extend below the guide rail 65 into the discharge chamber 53 and is fastened to a drive belt 55. The drive belt 55 moves the vertical guide rail 67 along the guide rail 65.

Figure 7:
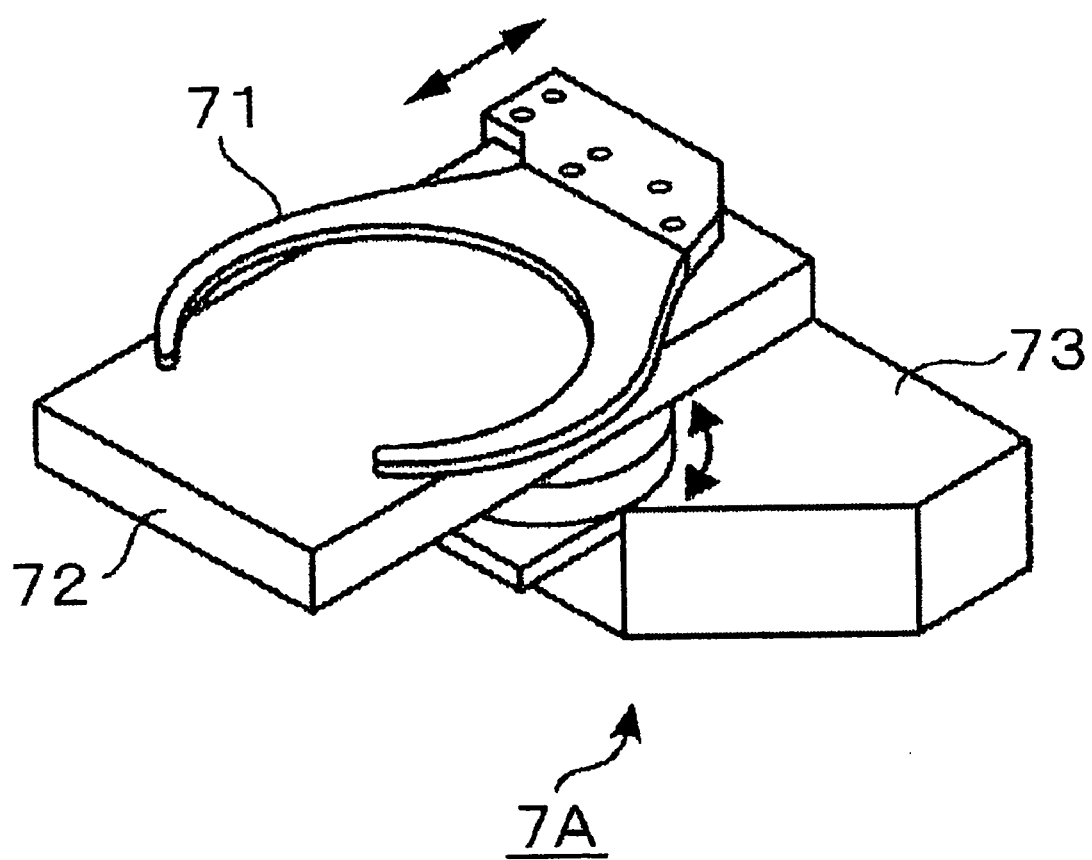
FIG. 7 is a perspective view of a shuttle arm moving unit in the DEV layer.

The carrying block M1 will be described with reference to FIGS. 2, 6 and 7. A carrying block M1 carries a wafer W from the carrier handling block S1 directly to the interface block S3. The carrying block M1 is interposed between the DEV layer B1 and the BCT layer B2. The carrying block M1 has a carrying space M2 separated from the carrying passage R1 of the DEV layer B1 by a partition plate 70a. The carrying block M1 is provided with a shuttle arm 7, namely, a direct carrying means. The shuttle arm 7 has a moving unit 7A and a drive unit 7B. The moving unit 7A moves in the carrying space M2. The moving unit 7A is provided with an arm member 71. For example, a peripheral part of the back surface of a wafer W is seated on the arm member 71. The arm member 71 is supported on a carrier base 72 for forward and backward movement. The carrier base 72 is supported on a moving base 73 so as to be turnable about a vertical axis.

The arm member 71, the carrier base 72 and the moving base 73 constitute the moving unit 7A. If the moving unit 7A is not subject to dimensional restrictions, the moving unit 7A may be provided with a lifting mechanism for vertically moving the carrier base 72.

The drive unit 7B has a box 70 defining a discharge chamber 70a. The drive unit 7B for moving the moving unit 7A is placed in the discharge chamber 7a. A guide rail 74 for guiding the moving unit 7a for transverse movement is extended transversely in front of the box 70. The shuttle arm 7 carries a wafer directly between a transfer stage TRS1B included in the shelf unit U5 and a transfer stage TRS5B included in the shelf unit U6.

The box 70 has a wall facing the carrying space M2 and provided with a suction opening 75. The guide rail 74 is provided with openings 74a arranged at transverse intervals so as to correspond to the suction opening 75. The back wall, opposite the front wall facing the carrying space M2, of the box 70 defining the discharge chamber 70a is provided with a plurality of discharge openings 77 arranged at transverse intervals. A discharge pipe 78 is connected to the discharge openings 77 to evacuate the discharge chamber 70a at a negative pressure. The drive unit 7B is formed so as to suck gas from the carrying space M2 into the discharge chamber 70a by evacuating the discharge chamber 70a at a negative pressure.

A gas supply unit 79 provided with, for example, a rectangular box is placed in the carrying space M2 so as to extend over the entire transverse length of the carrying space M2. The front wall, facing the carrying space M2, of the box 70 is provided with gas supply openings, not shown, arranged at fixed transverse intervals. A clean gas flowing through the gas supply unit 79 is blown through the gas supply openings so as to be diffused in the carrying space M2. The clean gas is supplied through the gas supply openings into the carrying space M2 and is discharged from the carrying space M2 through the discharge chamber 70a to remove particles from the carrying space M2. For example, flow of external air carrying particles from outside the coating and developing system into the carrying space M2 can be suppressed by properly controlling the supply of the clean gas into the carrying space M2 and the discharge of the clean gas from the carrying space M2.

Parts, adjacent to the carrier handling block S1, of the wafer carrying passage R1 and the carrying space M2 form a first wafer transfer space R2. As shown in FIGS. 1 and 3, the shelf unit U5 is disposed in the first wafer transfer space R2 so that the main arm A1, the shuttle arm 7 and the transfer arm C are able to access the shelf unit U5. A transfer arm D1, namely, vertically movable carrying means, for transferring a wafer W to the shelf unit U5 is disposed in the first wafer transfer space R2.

In the shelf unit U5, transfer stages TRS1B and TRS1 are disposed for the first unit block B1. The transfer stage TRS1B is put on top of the transfer stage TRS1. The transfer arm C, the shuttle arm 7 and the transfer arm D1 are able to access the transfer stage TRS1B. The main arm A1, the transfer arm C and the transfer arm D1 are able to access the transfer stage TRS1. Each of the transfer stages TRS1 and TRS1B has a square box, and a stage for supporting a wafer W. The stage is provided with a temperature adjusting mechanism for adjusting the temperature of a wafer W supported thereon to a predetermined temperature, and pins capable of being projected from the upper surface of the stage. The arm is able to advance into the box through an opening formed in a wall, facing the arm, of the box and to move into a space under a wafer W supported on the pins to support the wafer W thereon. Each of the arms is able to place a wafer W on the pins projecting from the stage.

As shown in FIG. 3, unit blocks B2, B3 and B4 are provided with two transfer stages TRS2, two transfer stages TRS3 and two transfer stages TRS4, respectively. The transfer stages TRS2 to TRS4 have the foregoing construction. A wafer W can be transferred between a main arm A2 and each of the transfer stages TRS2, between a main arm A3 and each of the transfer stages TRS3 and between a main arm A4 and each of the transfer stages TRS4. The transfer arm D1 is able to transfer a wafer W to and to receive a wafer W from each of the transfer stages TRS2 to TRS4. Each of the transfer stages TRS2 is able to transfer a wafer W to and to receive a wafer W from the transfer arm C. There is no limit to the number of the transfer stages TRS; each of the unit blocks may be provided with more than two transfer stages.

The transfer arm D1 moves to positions respectively corresponding to the unit blocks B1 to B4. The transfer arm D1 is able to move vertically and horizontally to transfer a wafer W to and receive a wafer W from each of the transfer stages TRS1 to TRS4 and the transfer stage TRS1B. The transfer stages TRS1 and TRS2 and the transfer stage TRS1B transfer a wafer W to and receive a wafer W from the transfer arm C.

Parts, adjacent to the interface block S3, of the wafer carrying passage R1 of the DEV layer B1 and the carrying space M2 of the carrying block M1 form a second wafer transfer space R3. As shown in FIG. 3, the shelf unit U6 is installed in the second wafer transfer space R3. The shelf unit U6 has an upper transfer stage TRS5B and a lower transfer stage TRS5. The transfer stage TRS5B is able to transfer a wafer W to and to receive a wafer W from each of the shuttle arm 7 and an interface arm B. The transfer stage TRS5B is the same in construction, for example, as the transfer stage TRS1B and has a cooling function to cool a wafer W. The transfer stage TRS5B is able to control the temperature of a wafer W.

Figure 8:
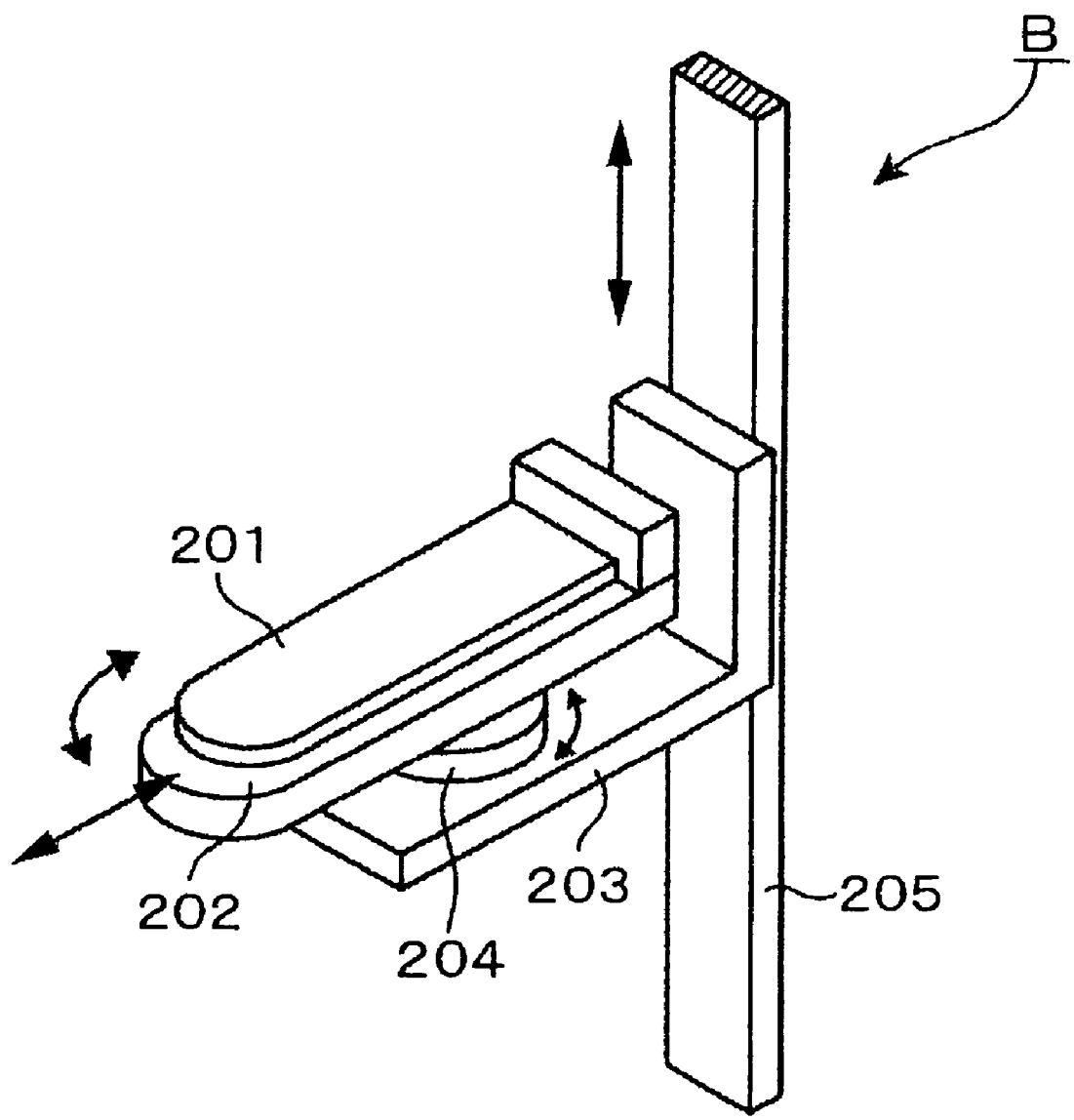
FIG. 8 is a perspective view of an interface arm included in the coating and developing system shown in FIG. 1.

The exposure system S4 is connected to the back end of the shelf unit U6 of the processing block S2 by the interface block S3. The interface block S3 is provided with the interface arm B. A wafer W is transferred between the interface arm B and the shelf unit U6 of the processing block S2 and between the interface arm B and the exposure system S4. As shown in FIG. 8 by way of example, the interface arm B has a base 202, an arm member 201 supported on the base 202 for movement in opposite directions, a lifting member 203 supporting the base 202, a turning mechanism 204 supporting the base 202 for turning abut a vertical axis on the lifting member 203, and a vertical rail 20-5 guiding the lifting arm 203 for vertical movement. The arm member 201 can be advanced and retracted, can be vertically moved and can be turned about a vertical axis. The transfer arm D1 is similar in construction to the interface arm B, except that the transfer arm D1 does not turn about a vertical axis.

The interface arm B is a wafer carrying means for carrying a wafer W between the processing block S2 and the exposure system S4. I this embodiment, the interface arm B receives a wafer W from the transfer stage TRS5B of the carrying block M1, carries the wafer W to the exposure system S4, receives the wafer W from the exposure system S4 and carries the wafer W to the transfer stage TRS5.

The other unit blocks will be briefly described. The BCT layer B2, the COT layer B3 and the TCT layer B4 are substantially similar in construction to the DEV layer B1 and differ from the DEV layer B1 in using a chemical liquid for forming an antireflection film or a chemical liquid (liquid resist) for forming a resist film instead of using the developer, carrying out coating methods different from the coating method to be carried out by the DEV layer B1, shelf units U1 to U4 having heating devices and cooling devices that operates on process conditions different from those on which the devices of heating and cooling systems of the DEV layer B1 operate, and not having any unit corresponding to the shelf unit U6 on the side of the interface unit S3. One of the unit blocks B2 to B4 is provided with a periphery-exposing exposure unit for exposing a peripheral part of a wafer W. The shelf units U1 to U4 of the COT layer B3 include hydrophobicity imparting units for imparting hydrophobicity to a wafer W.

The coating and developing system is provided with a controller 100 having a program storage unit, such as a computer. The program storage unit stores programs, namely, pieces of software, including instructions specifying operations for the coating and developing system to execute, such as processes for processing wafers W, wafer transferring operations, operations for controlling discharging and air flow and operations for managing recipes of the carrying passages. The controller 100 reads the programs from the program storage device and controls the operations of the coating and developing system according to the programs. The program storage unit holds recording mediums holding the programs, such as hard disks, compact disks or magnetoopetical disks.

The recipes of carrying passages specify wafer carrying passages along which wafers W are to be carried for different processes; that is the recipes of carrying passages specify order of modules including the transfer stages and the units. The recipes are produced beforehand respectively for the processes. The operator selects one of the processes, and then the controller 100 reads the recipe for the selected process from the program. A processing mode for carrying a test wafer W to the exposure system to inspect the exposure system, namely, an exposure system inspecting mode, is another choice other than the processes for processing wafers W to fabricate products. When this processing mode, namely, the exposure system inspecting mode, is selected, the shuttle arm 7 carries a wafer W from the carrier handling block S1 to the interface block S3 and carries the wafer W from the interface block S3 back to the carrier handling block S1.

The flow of a wafer W will be described on an assumption that the coating and developing system operates to form a resist film a lower antireflection film underlying the resist film and an upper antireflection film overlying the resist film. A carrier 20 is delivered to the carrier handling block S1. The transfer arm C takes out a wafer W from the carrier 20 and transfers the wafer W to the transfer stage TRS2 of the shelf unit U5. Then, the wafer W is transferred from the transfer stage TRS2 to the main arm A2 of the BCT layer B2. The main arm A2 carries the wafer W in the BCT layer B2 to the cooling unit, the antireflection film forming unit, not shown, corresponding to the developing unit 3 shown in FIG. 5, the heating unit and the transfer stage TRS2 of the shelf unit U5 in that order. Thus a lower antireflection film is formed.

Subsequently, the transfer arm D1 carries the wafer W from the transfer stage TRS2 to the transfer stage TRS3 of the COT layer B3. Then, the main arm A3 of the COT layer B3 carries the wafer W from the transfer stage TRS3 to the cooling unit, the resist applying unit, not shown, corresponding to the developing unit 3 shown in FIG. 5, and the heating unit in that order. Thus a resist film on the lower antireflection film is formed. Then, the wafer W is carried to the periphery-exposing exposure unit for exposing a peripheral part of the wafer W. Then, the wafer W is carried to the transfer stage TRS3 of the shelf unit U5.

Subsequently, the transfer arm D1 carries the wafer W from the transfer stage TRS3 to the transfer stage TRS4 of the TCT layer B4. Then, the main arm A4 of the TCT layer B4 carries the wafer W to the cooling unit, the second antireflection film forming unit, not shown, corresponding to the developing unit 3 shown in FIG. 5, and the heating unit in that order. Thus an upper antireflection film is formed on the resist film. Then, the wafer W is carried to the transfer stage TRS4 of the shelf unit U5.

Then, the transfer arm D1 carries the wafer W from the transfer stage TRS4 to the transfer stage TRS1B. Subsequently, the moving unit 7A of the shuttle arm 7 receives the wafer W, turns toward the interface block S3 and moves toward the interface block S3 to carry the wafer W to the transfer stage TRS5B. The interface arm B carries the wafer W from the transfer stage TRS5B to the exposure system S4. The exposure system S4 processes the wafer W by a predetermined exposure process.

After the completion of the exposure process, the interface arm B carries the wafer W to the transfer stage TRS5 of the shelf unit U6. Then, the main arm A1 of the DEV layer B1 carries the wafer W to the heating unit, the cooling unit, the developing unit 3, the heating unit and the cooling unit of the shelf units U1 to U4 of the DEV layer B1 in that order to process the wafer W by a predetermined developing process. After the completion of the developing process, the wafer W is carried to the transfer stage TRS1 of the shelf unit U5. Then, the transfer arm C carries and returns the wafer W to the carrier 20 held in the carrier handling block S1.

Figure 9:
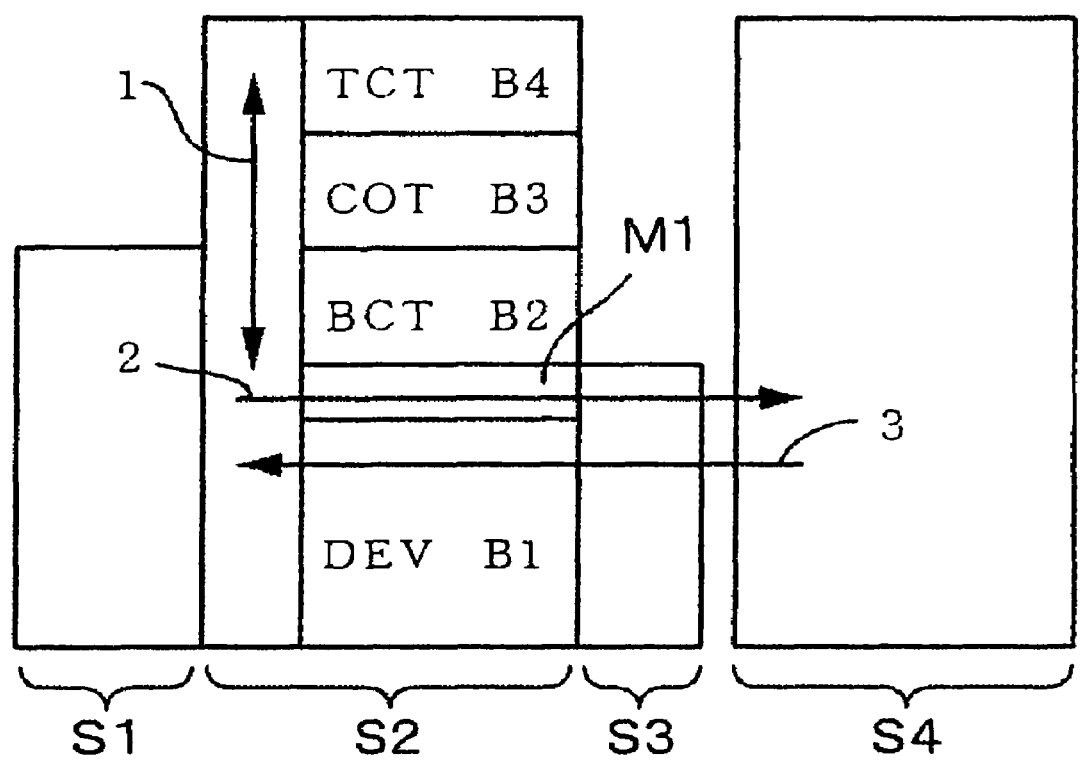
FIG. 9 is a typical view of assistance in explaining a wafer carrying path in the coating and developing system shown in FIG. 1.

FIG. 9 typically shows the carrying passages along which the wafer W is carried for the foregoing processes. The wafer W is moved in the film forming unit blocks B2 to B4 to form the films (Step 1). The wafer W is carried from a part, on the side of the carrier block S1, of the processing block S2 via the carrying block M1 to a part, on the side of the interface block S3, of the processing block S2 by the shuttle arm 7, and is carried to the exposure system S4 (Step 2). The wafer W processed by the exposure process is returned from the exposure system S4 to the DEV layer B1, is processed by the developing process by the DEV layer B1 and is returned to the carrier handling block S1 (Step 3).

Description will be made of a carrying passage along which a wafer W is carried directly to the exposure system S4 for the maintenance of the exposure system S4 without being processed by the unit blocks B2 to B4. The controller 100 selects an exposure system inspection mode. Then, a carrier 20 is delivered to the carrier handling block S1. The transfer arm C takes out a test wafer having a surface coated with, for example, a resist film from the carrier 20 and carries the test wafer W to the transfer stage TRS1B. The moving unit 7A of the shuttle arm 7 carries the test wafer W from the transfer stage TRS1B directly to the transfer stage TRS5B. The interface arm B carries the test wafer W from the transfer stage TRS5B to the exposure system S4. The test wafer W is used for maintenance work for adjusting the focusing accuracy and positioning accuracy of the exposure system S4, examining the distortion and transmittance of lenses, and inspecting the optical system for contamination with dust.

After the completion of the maintenance work, the interface arm B carries the test wafer W from the exposure system S4 to the transfer stage TRS5B. Then, moving unit 7A of the shuttle arm 7 carries the test wafer W from the transfer stage TRS5B directly to the transfer stage TRS1B. Then, the test wafer W is returned from the transfer stage TRS1B to the carrier 20 by the transfer arm C.

The processing block S2 of the coating and developing system in this embodiment has the layered structure of the coating unit blocks B2 to B4 and the developing unit block B1 extending between the carrier handling block S1 and the interface block S3. Therefore, the coating and developing system needs a narrow floor space for installation. The carrying block M1 is disposed between the DEV layer B1 and the BCT layer B2, and the carrying block M1 is provided with the shuttle arm 7 for carrying a wafer W from the carrier handling block S1 directly to the interface block S3. Therefore, operations for the maintenance of the exposure system S4, the coating unit blocks B2 to B4 and the developing unit block B1 can be simultaneously executed and hence time necessary for maintenance can be curtailed. Even if the coating unit blocks B2 to B4 and the developing unit block B1 are under maintenance work or those unit blocks are inoperative due to a trouble, such as a trouble in the discharge system, the test wafer W for inspecting the exposure system S4 can be carried from the carrier handling block S1 to the exposure system S4 by the shuttle arm 7 of the carrying block M1. Thus the inspection of the exposure system S4 can be executed at desired time. Therefore, operations for processing a wafer W for producing a product can be started immediately after the coating unit blocks B2 to B4 and the developing unit block B1 have become operative and the reduction of throughput can be suppressed. When the adjustment of the shuttle arm 7 is completed first before starting the coating and developing system for the first time after the completion of installation, work for adjusting the exposure system S4 can be performed by carrying a test wafer W by the shuttle arm 7 independently of work for adjusting the main arms A1 to A4 of the developing unit block B1 and the coating unit blocks B2 to B4. When the adjustment of the exposure system S4 is completed, the exposure system S4 can be immediately set for exposure conditions and, consequently, time necessary for starting up the coating and developing system after installation can be curtailed. In the coating and developing system in this embodiment, the developing unit block B1 is disposed under the coating unit blocks B2 to B4, and the carrying block M1 having the shuttle arm 7 is interposed between the unit blocks B1 and B2. Therefore, the vertical stroke of the interface arm B of the interface block S3 may be short and hence the carrying means including the interface arm B can be formed in a small size.

The numbers of the layers of the unit blocks and order of stacking up the unit blocks are not limited to those mentioned above. For example, the coating unit blocks may be stacked up in order of the TCT layer, the COT layer and the BCT layer. The developing unit block may be placed on top of the layered structure of the coating unit blocks. When any antireflection films are not formed and only a resist film is formed on a wafer W, the coating and developing system may be provided with only the COT layer as a coating unit block. The lower antireflection film, the resist film and the upper antireflection film may be formed by a single coating unit block. The coating and developing system may be formed by stacking up a plurality of such layers. The DEV layer B1 may be provided with, for example, two superposed developing units similar to the developing unit 3.

Although the wafer carrying passage R1 of the DEV layer B1 is separated from the carrying space M2 of the carrying block M1 by the partition plate 70a to prevent particles from falling into the wafer carrying passage R1 in the coating and developing system in this embodiment, the partition plate 70a may be omitted. If the partition plate 70a is omitted, the moving space in which the moving unit 7A moves may be formed slightly above the upper end of the main arm A1 at the upper end of the moving space in which the main arm A1 moves to prevent interference between the main arm A1 and the moving unit 7A.

The shuttle arm 7, namely, a direct carrying means, may be any suitable mechanism other than that mentioned above. For example, the shuttle arm 7 may include, instead of the carrier base 72 and the arm member 71 that moves along the carrier base 72, an arm member 71 and an swivel base 72 supporting the arm member 71 and capable of turning so as to insert the arm member 71 in a space under a wafer W lifted up by the pins of the transfer stage TRS1B or TRS5B to support the wafer W on the arm member 71 and of turning so as to carry the wafer W between the transfer stages TRS1B and TRS5B.

The direct carrying means needs only to carry a wafer W directly from the carrier handling block S1 to the interface block S3 without passing either of the coating unit and the developing unit. Therefore, the direct carrying means may be a belt conveyor mechanism instead of the carrying arm mechanism. For example, the transfer stages TRS1B and TRS5B may be formed in a U-shape, a conveyor belt may be extended between spaces formed in the U-shaped transfer stages TRS1B and TRS5B to carry a wafer between the transfer stages TRS1B and TRS5B. Another possible direct carrying means may have a member extended between the transfer stages TRS1B and TRS5B, having a slope sloping down toward the transfer stage TRS5B, and provided with side guide rails for preventing a wafer W from falling off the slope and with air jetting holes in a part, on the side of the transfer stage TRS5B, of the slope. A wafer W can be pushed on to the transfer stage TRS5B by the weight of the wafer W and the pressure of air jetted through the air jetting holes.

The direct carrying means included in the coating and developing system according to the present invention is intended for directly carrying a wafer W between the carrier handling block and the interface block without passing either of the coating unit and the developing unit. However, for example, a periphery-exposing exposure unit and an inspection unit may be disposed on the carrying passage of the direct carrying means. Direct carrying signifies also carrying a wafer between the respective carrying means of the carrier handling block and the interface block through the periphery-exposing exposure unit and the inspection unit.

The invention claimed is:

1. A coating and developing system comprising:
    a carrier handling block for receiving a carrier containing substrates;
    a processing block for forming films including a photosensitive film on a substrate received from the carrier handling block, for developing the exposed photosensitive film processed by an exposure process by an exposure system and for returning the substrate to the carrier handling block;
    an interface block for transferring the substrate from the processing block to the exposure system and transferring the substrate from the exposure system to the processing block; wherein
    a) the processing block has coating blocks, for forming the films including the photosensitive film on the substrate, extending between the carrier handling block and the interface block, and a developing block stacked up in layers with respect to the coating blocks,
    b) each of the coating blocks and the developing block is provided with a chemical liquid applying unit for applying a chemical liquid to the substrate, a heating unit for heating the substrate, a cooling unit for cooling the substrate and interblock carrying means for carrying the substrate from one to another of those units,
    c) a direct carrying means is stacked up in layers with respect to the coating block and the developing block to carry a substrate directly between the carrier handling block and the interface block, and
    d) the direct carrying means carries a substrate coated with the films from a position on the side of the carrier handling block to a position on the side of the interface block.

2. The coating and developing system according to claim 1, wherein the coating block includes a layered structure of a resist film forming block for forming a resist film, a first antireflection film forming block for forming a first antireflection film under the resist film, and a second antireflection film forming block for forming a second antireflection film over the resist film.

3. The coating and developing system according to claim 2, wherein the developing block is disposed below the coating block.

4. The coating and developing system according to claim 2, wherein the direct carrying means is formed to move in a carrying block separated from the coating block and the developing block.

5. The coating and developing system according to claim 2 further comprising: a plurality of transfer stages stacked up in layers and arranged so that a substrate can be carried thereto and can be carried away therefrom by the interblock carrying means of the coating block, the interblock carrying means of the developing block and the direct carrying means and vice versa; and vertical carrying means for carrying a substrate to and receiving a substrate from each of the plurality of transfer stages.

6. The coating and developing system according to claim 2 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

7. The coating and developing system according to claim 1, wherein the developing block is disposed below the coating block.

8. The coating and developing system according to claim 7, wherein the direct carrying means is formed to move in a carrying block separated from the coating block and the developing block.

9. The coating and developing system according to claim 3 further comprising: a plurality of transfer stages stacked up in layers and arranged so that a substrate can be carried thereto and can be carried away therefrom by the interblock carrying means of the coating block, the interblock carrying means of the developing block and the direct carrying means and vice versa; and vertical carrying means for carrying a substrate to and receiving a substrate from each of the plurality of transfer stages.

10. The coating and developing system according to claim 3 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

11. The coating and developing system according to claim 1, wherein the direct carrying means is formed to move in a carrying block separated from the coating block and the developing.

12. The coating and developing system according to claim 11, wherein the carrying block is interposed between the developing block and the coating block.

13. The coating and developing system according to claim 12 further comprising a gas supply device for supplying a gas into the carrying block to maintain the interior of the carrying block at a positive pressure.

14. The coating and developing system according to claim 12 further comprising: a plurality of transfer stages stacked up in layers and arranged so that a substrate can be carried thereto and can be carried away therefrom by the interblock carrying means of the coating block, the interblock carrying means of the developing block and the direct carrying means and vice versa; and vertical carrying means for carrying a substrate to and receiving a substrate from each of the plurality of transfer stages.

15. The coating and developing system according to claim 12 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

16. The coating and developing system according to claim 11 further comprising a gas supply device for supplying a gas into the carrying block to maintain the interior of the carrying block at a positive pressure.

17. The coating and developing system according to claim 16 further comprising: a plurality of transfer stages stacked up in layers and arranged so that a substrate can be carried thereto and can be carried away therefrom by the interblock carrying means of the coating block, the interblock carrying means of the developing block and the direct carrying means and vice versa; and vertical carrying means for carrying a substrate to and receiving a substrate from each of the plurality of transfer stages.

18. The coating and developing system according to claim 16 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

19. The coating and developing system according to claim 11 further comprising: a plurality of transfer stages stacked up in layers and arranged so that a substrate can be carried thereto and can be carried away therefrom by the interblock carrying means of the coating block, the interblock carrying means of the developing block and the direct carrying means and vice versa; and vertical carrying means for carrying a substrate to and receiving a substrate from each of the plurality of transfer stages.

20. The coating and developing system according to claim 11 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

21. The coating and developing system according to claim 1 further comprising: a plurality of transfer stages stacked up in layers and arranged so that a substrate can be carried thereto and can be carried away therefrom by the interblock carrying means of the coating block, the interblock carrying means of the developing block and the direct carrying means and vice versa; and vertical carrying means for carrying a substrate to and receiving a substrate from each of the plurality of transfer stages.

22. The coating and developing system according to claim 21 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

23. The coating and developing system according to claim 1 further comprising a controller for controlling carrying operations for carrying a substrate, wherein the controller is capable of selecting a test substrate carrying mode for carrying a test substrate from the carrier handling block to the exposure system by the direct carrying means to test the condition of the exposure system.

* * * * *